United States Patent [19]

Richter et al.

[11] 3,948,665

[45] Apr. 6, 1976

[54] LAMINATES FOR THE MANUFACTURE OF FLEXOGRAPHIC PRINTING PLATES COMPRISING PHOTOCROSSLINKABLE REACTION PRODUCT OF SATURATED POLYESTER GLYCOL, DIISOCYANATE, AND DIOL

[75] Inventors: Peter Richter, Ludwigshafen; Herbert Stutz, Karlsruhe; Lothar Metzinger, Bad Duerkheim; Otto Volkert, Ludwigshafen; Heinz-Ulrich Werther, Ludwigshafen; August Wigger, Frankenthal, all of Germany

[73] Assignee: BASF Aktiengesellschaft, Ludwigshafen (Rhine), Germany

[22] Filed: Jan. 2, 1974

[21] Appl. No.: 429,737

[30] Foreign Application Priority Data

Jan. 5, 1973 Germany............................ 2300371

[52] U.S. Cl.................... 96/86 P; 96/35.1; 96/36.3; 96/87 R; 96/115 R; 204/159.14; 204/159.19; 260/75 NP; 101/456; 101/461
[51] Int. Cl.².... G03C 1/94; G03C 5/00; G03F 7/00
[58] Field of Search ............. 96/115 R, 115 P, 35.1, 96/87 R, 86 P; 260/75 NK, 75 NP, 859 R, 77.5 CR; 204/159.24, 159.15, 159.19; 101/456, 461

[56] References Cited

UNITED STATES PATENTS

| | | | |
|---|---|---|---|
| 3,782,961 | 1/1974 | Takahashi et al................. | 96/115 R |
| 3,840,369 | 10/1974 | Carcick et al................. | 96/115 P X |
| 3,850,770 | 11/1974 | Juna et al...................... | 96/115 P X |
| 3,864,133 | 2/1975 | Nisamatsu et al................ | 96/115 P |

*Primary Examiner*—Edward C. Kimlin
*Attorney, Agent, or Firm*—Johnston, Keil, Thompson & Shurtleff

[57] ABSTRACT

Laminates for the production of relief plates for flexographic printing, by imagewise exposure and washing out with a developer solution have, on a base optionally provided with an elastomeric layer, a photocrosslinkable layer containing a photoinitiator and consisting of a polyurethane elastomer which has been prepared in a special manner from an aliphatic saturated polyesterglycol, an aliphatic diisocyanate, but-1-ene-3,4-diol and, if desired, another diol and which has a Shore A hardness of 30 to 90° in the photocrosslinked state, the elastomer being optionally mixed with a photo-crosslinked monomer.

2 Claims, No Drawings

LAMINATES FOR THE MANUFACTURE OF FLEXOGRAPHIC PRINTING PLATES COMPRISING PHOTOCROSSLINKABLE REACTION PRODUCT OF SATURATED POLYESTER GLYCOL, DIISOCYANATE, AND DIOL

The present invention relates to a process for the production of relief plates which are suitable for flexographic printing by imagewise exposure of a photo-crosslinkable layer which contains a special polyurethane elastomer, and to photo-crosslinkable laminates for the production of such printing plates.

Flexography is used for printing packaging materials such as paper, cellophane, metal foils and plastic films. Flexographic printing has hitherto been carried out exclusively with rubber plates which are produced by a rather expensive and time-consuming multi-step process. An original metal plate is produced by exposure to light and etching and is used to impress a suitable matrix material, and the rubber plate is subsequently produced by taking an impression of the matrix whilst vulcanizing the rubber with the application of heat and pressure. Moreover, in view of the high demands made on printing quality nowadays the reproduction of complicated subjects of halftone and type matter is only possible with special printing plates composed of different types of rubber. There have therefore been many attempts to use other systems for the production of printing plates for flexographic printing. For example, U.S. Pat. No. 3,024,180 and German Published Applications (DOS) Nos. 2,062,563 and 2,138,582 have disclosed photopolymeric plates for flexographic printing which contain, in a photo-crosslinkable layer, a mixture of an elastomeric polymer such as chloroprene or nitrile rubber with photo-crosslinkable olefinically unsaturated monomers, and a photoinitiator. However, a relatively high content of photo-crosslinkable monomers is usually necessary for insolubilizing the exposed parts of the printing plate by crosslinking. This may lead to incompatibility of the components, resulting in exudation of the monomers; in addition, photopolymerization of the monomers adversely affects the elastic properties of the co-used polymer. Printing reliefs of lower elasticity are produced, and these are capable of only inadequately adapting themselves to irregularities in the surface of the printing stock. U.S. Pat. No. 3,658,531 discloses the use of soluble polyether polyurethanes, which have been manufactured using olefinically unsaturated low molecular diols as chain extenders, together with photoinitiators, as a photo-crosslinkable layer for flexible printing plates. However, their light transmission is unsatisfactory and the solvent resistance of the exposed parts of the plate leaves something to be desired.

Finally, it is also known (cf. German Printed Application (DAS) No. 1,522,362 and German Published Application (DOS) No. 2,115,373) to use photosensitive liquid low molecular weight prepolymers for the manufacture of printing plates. However, the processing of these systems leaves something to be desired since the production of layers from these tacky viscous liquids requires special coating equipment and furthermore the negative cannot be placed directly on the surface to be exposed to light.

It is an object of the present invention to provide elements which enable relief plates for flexographic printing to be produced in a simple manner and which do not suffer from the disadvantages of the known systems or only suffer from them to a lesser extent.

We have found that relief plates which are particularly suitable for flexographic printing can be produced by imagewise exposure of a layer A of a photo-crosslinkable material, containing 0.01 to 10 percent by weight of photoinitiator and, if desired, further conventional additives, on a base and subsequent washing out of the unexposed areas of the layer A with a developer, if the photo-crosslinkable material of layer A consists essentially of (a) 70 to 100 percent by weight of a non-crystallizing polyurethane elastomer (A11) which is soluble in the developer and has been produced by reaction of an aliphatic saturated polyester glycol having a molecular weight of about 400 to 4,000 (PG) with an aliphatic diisocyanate (DI) and at least one low molecular weight aliphatic diol (OL), of which 25 to 100 mole percent is but-1ene-3,4-diol, as chain extender, the molar ratio of polyester glycol to diisocyanate to low molecular weight diol being about 1:3 to 6:2 to 5 and the NCO/OH molar ratio always being about 0.9 to 1.0, or of a mixture of the polyurethane elastomer (A11) with up to 30% of its weight of another compatible light-transmitting polymer (A12), and (b) 0 to 30 percent by weight of a photo-crosslinkable monomer with C—C multiple bonds which is substantially compatible with the polyurethane elastomer, the layer A having Shore A hardness of 30° to 90° in the photo-crosslinked state.

We have found also that laminates having the said photo-crosslinkable material in layer A are particularly suitable for the production of flexographic printing plates, in which laminates layer A is firmly bonded to a non-photo-crosslinkable layer Z which may act as base during the process and is based on a polyurethane elastomer which is not soluble in the developer solution and which has a Shore A hardness of from 15° to 70° which is at least 20° less than the Shore A hardness of the layer A in the photo-crosslinked state, to Shore A hardness of layer A being preferably from 50° to 90°.

The polyurethane elastomer (A11) which are used, according to the invention, in the photo-crosslinkable mixture and are soluble in the developer and do not crystallize are produced by reaction of an aliphatic saturated polyester glycol (PG) having a molecular weight of from about 400 to 4,000 and especially from 600 to 2,000 with an aliphatic diisocyanate (DI) and one or more lower molecular aliphatic diols (OL) as extenders. Particularly suitable polyester glycols (PG) are polyesters of saturated aliphatic dicarboxylic acids of 4 to 18 carbon atoms, such as succinic acid, adipic acid, glutaric acid, sebacic acid, heptadecanedicarboxylic acid or their mixtures, and aliphatic diols generally having from 2 to 12 carbon atoms, such as ethylene glycol, 1,2-propylene glycol, 1,3-propylene glycol, 1,3-butanediol, 1,4-butanediol, 1,6-hexanediol, 1,10-dicanediol, neopentyl glycol and aliphatic diols of which the carbon chain is interrupted by oxygen atoms or sulfur atoms, such as diethylene glycol, triethylene glycol, dipropylene glycol or thiodiglycol. Polyester glycols produced from aliphatic hydroxycarboxylic acids, such as hydroxypivalic acid and ε-hydroxycaproic acid, if desired in admixture with the above-mentioned dicarboxylic acids and diols, can also be used. Aliphatic components for the polyester are to be understood as also including cycloaliphatic components.

Suitable aliphatic diisocyanates (DI), which are also intended to include cycloaliphatic diisocyantes, generally have 6 to 30 carbon atoms. Pentamethylenediisocyanate, hexamethylenediisocyanate, nonadecanediisocyanate, 2,2,4- and 2,4,4-trimethylhexamethylenediisocyanate, isophoronediisocyanate, cyclohexylenediioscyanate, bis-(4-isocyanate, cyclohexylenediisocyanate, bis-(4-isocyanatocyclohexyl)-methane and 2,2-bis-(isocyanatocyclohexyl)-propane may be mentioned as examples.

The low molecular weight aliphatic diol (OL) used for the production of the polyurethane elastomer (All) according to the invention, or mixtures of such compounds, should contain 25 to 100 mole percent, preferably 50 to 100 mole percent, of but-1-ene-3,4-diol. If olefinically unsaturated diols mixed with but-1-ene-3,4-diol are used, diols which do not homopolymerize by free radical mechanisms or only have a slight tendency to do so, are preferred. The but-1-ene-3,4-diol is preferably used together with but-2-ene-1,4-diol, 2,3-dichloro-but-2-ene-1,4-diol and/or saturated aliphatic diols having a molecular weight not exceeding 200, such as ethylene glycol, propylene glycol, 1,3-butanediol, 1,4-butanediol and neopentyl glycol. When using but-1-ene-3,4-diol in admixture with saturated aliphatic diols, an advantageous molar ratio has proved to be from about 1:4 to 4:1.

In the production of the polyurethane elastomers used according to the invention, the polyester glycol (PG), the diisocyanate (DI) and the low molecular weight diol (OL) are used in a molar of about 1:2 to 6:1 to 5 and preferably of about 1:2:1, the ratio of the isocyanate groups to the hydroxyl groups always being about 0.9 to 1.0 and preferably about 0.96 to 1.0.

The polyurethane elastomers can be produced by conventional methods, in the melt or in a suitable solvent in which the reaction product is soluble, by reacting the higher molecular weight polyester glycols with the diisocyanate to give a prepolymer with terminal isocyanate groups and subsequent chain lengthening by the addition of the aliphatic diols at temperatures of 40° to 120°C and especially of 40° to 80°C, the reaction sequence being preferred. The polyaddition reaction can also be accelerated by adding a catalyst conventionally used for this purpose, such as tertiary amines, tin compounds and the like, such as dibutyl-tin dilaurate of N,N'-endoethylene-piperazine, in amounts of, in particular, 0.001 to 0.5 percent by weight.

The resulting polyurethane elastomers do not crystallize even on prolonged storage and are soluble in organic solvents which can be used as developers for washing out the unexposed areas of the layer A after imagewise exposure. Examples of suitable developers are ketones, such as methyl ethyl ketone, cyclic ethers, such as tetrahydrofuran, N-substituted amides, such as dimethylformamide, or mixtures of these solvents with, for example, ethyl acetate or toluene. The solubility of the polyurethane enables the photo-crosslinkable mixtures to be applied in the form of solutions to suitable base materials or intermediate layers, and also permit rapid removal of the non-crosslinked areas of the printing plate during washout. The areas of the layer A which have been crosslinked by exposure to light and which form the printing relief, on the other hand, have a printing surface which is adequately resistant to the extenders usually used in flexographic printing and to the solvents present in flexographic printing inks. It is a particular advantage of the polyurethane elastomers used according to the invention that they do not undergo premature thermal crosslinking during processing or storage but play an active part in the crosslinking reaction brought about by radiation, and become sufficiently insoluble even in the absence of photo-crosslinking monomers. This makes it possible for photo-crosslinking layers A containing the polyurethane elastomer used according to the invention to cure very well even when mixed with only a very low amount of photo-crosslinking monomers, with only a slight change in the mechanical properties of the layer A, such as the Shore hardness, resilience and the like, as compared with the unexposed material. Though the monomers can be used in the mixture in amount of 0.01 to 30 percent by weight and especially in amounts of 0.1 to 15 percent by weight, bases on the polymer/monomer mixture, an amount of 0.5 to 5 percent by weight of monomer is in many cases perfectly satisfactory for the achievement of good flexographic printing plates. As a result, many of the disadvantages which frequently arise in the case of mixtures of polymers with major amounts of monomers do not manifest temselves at all.

Suitable photo-crosslinkable monomers with C—C multiple bonds which are added to the mixture, especially to achieve greater hardness and a higher degree of crosslinking, are monomers which are subsubstantially compatible with the polyurethane elastomer (All), i.e. monomers which do not separate out even if the mixture with the polyurethane is allowed to stand for a prolonged period and which can be caused to photo-crosslink or photopolymerize by electromagnetic radiation in the presence of a photo-initiator and are soluble, in the unexposed state, in the developer. Furthermore, the monomers should show no tendency to crystallize out. Examples of particularly suitable monomers are the acrylates and especially the diacrylates and polyacrylates as well as the corresponding methacrylates of aliphatic or cycloaliphatic diols and polyols generally having from 2 to 20 carbon atoms, such as ethylene glycol diacrylate, 1,2-propylene glycol diacrylate, 1,4-butanediol dimethacrylate, diethylene glycol diacrylate, triethylene glycol dimethacrylate, 2,2-dimethylpropane-1,3-diol diacrylate, glycerol trimethacrylate, 1,1,1-trimethylolpropane triacrylate, pentaerythritol tetraacrylate, 1,4-cyclohexanediol diacrylate and 2-hydroxyethyl acrylate. Acrylic acid and methacrylic acid derivatives with amide groupings, such as N-methylolacrylamide, N-methylolacrylamide n-butyl ether or the diethers of aliphatic diols and N-methylolacrylamide or N-methylolmethacrylamide can also be used as monomers. The choice of the amount and type of the monomer can, in the event of the desired effect being in doubt, be resolved by a few simple experiments. In contrast to most of the known systems, monomers with copolymerization parameters $r_2$ of about 0, which cannot form homopolymers by themselves but do crosslink with polyurethanes, such as allyl compounds, for example allyl esters and allyl halides, or maleic acid dialkyl esters, can also be used in conjunction with the polyurethane elastomers used according to the invention.

The polyurethanes or polyurethane-monomer mixtures additionally contain 0.01 to 10 percent by weight, and preferably 0.01 to 5 percent by weight, of a photo-initiator i.e. a compound which under the action to light, decomposes into free radicals or reacts with the formation of free radicals which initiate the polymerization. Examples of suitable photoinitiators are vicinal ketaldonyl compounds, diacetyl and benzil, α-ketaldonyl alcohols, such as benzoin, acyloin ethers, such as benzoin methyl ether, benzoin isopropyl ether or α-methylolbenzoin methyl ether and/or aromatic acyloin substituted in the α-position, such as α-methylbenzoin, and aromatic aldehydes and ketones, such as benzophenone, propiophenone or benzaldehyde.

The photo-crosslinkable mixture may also contain other conventional additives, such as thermal polymerization inhibitors, for example p-benzoquinone, p-methoxyphenol, mono-tert-butyl-hydroquinone, o-dihydroxybenzene, methylene blue, β-naphthylamine, β-naphthol or salts of N-nitrosocyclohexylhydroxylamine. For a better assessment of the relief image it may be useful to add to the photo-crosslinkable layer A a dye which can be added in any amount provided it does not absorb the electromagnetic radiation in the actinic range of the layer. If the dye is absorptive of actinic light, it is used, depending on the degree of absorption, in amounts of about 0.001 to 2.5, and preferably of about 0.005 to 0.5, percent by weight based on the weight of the photo-crosslinkable layer A.

Although the photo-crosslinkable mixture generally contains 75 to 100 percent by weight, and preferably 85 to 99.5 percent by weight, of the polyurethane elastomer (A11), it is also possible, in order to achieve special properties, to use a mixture of the polyurethane elastomer (A11) with up to 30%, and especially 5 to 20%, of its weight of another substantially compatible polymer (A12) which transmits light, for example a mixture with vinyl chloride polymers or vinylidene chloride polymers or phenoxy resins or cellulose esters and the like.

However, when selecting the components of the photo-crosslinkable layer A it must always be borne in mind that in the photo-crosslinkable state layer A should have a Shore A hardness of 30 to 90°, and preferably of 50° to 90°. The photo-crosslinkable mixture for layer A can be applied to conventional based by conventional methods. Particularly suitable based (B) which should be dimensionally stable under the conditions of production and processing of the relief printing plates, are thin steel or aluminum sheets and foils and dimensionally stable flexible plastics films, such as polyester films or polyamides films.

In (a) preferred embodiment of the laminates for the production according to the invention of flexo graphic printing plates, the photo-crosslinkable layer A is firmly bonded to non-photo-crosslinkable layer Z based on a polyurethane elastomer which is insoluble in the developer and the Shore A hardness of which is from 15° to 70°, and especially from 20° to 60° and is at least 20°, and preferably 20° to 50°, less than the Shore A hardness of the layer A in the photo-crosslinked state. Instead of the polyurethane elastomers, layers of other elastomeric polymers, such as natural or synthetic rubber, can also be used for the production of one or more elastic layers which provide a sufficiently resilient support for the photo-crosslinked layer A above them and which adapt themselves to the variations in height of the printing stock, and compensate for press tolerances, provided they meet the said hardness requirements and are not dissolved by the developer used to wash out layer A. Whilst the thickness of the photo-crosslinkable layer A is in general from 0.1 to 4, and especially from 0.1 to 1.0, mm, the thickness of the layer Z is in general from about 0.1 to 5, and especially from 1 to 3, mm. The layer can be firmly bonded together in a conventional manner by laminating or by means of a thin layer of a adhesive based on polyurethane or polychloroprene. If polyurethane elastomers are used for the photo-crosslinkable layer A and the layer Z, it generally suffices to laminate the second layer onto the first in the presence of a small quantity of an organic solvent, such as tetrahydrofuran.

Practically any light source emitting sufficiently intense light can be used for exposing the photo-crosslinkable layer, for example, xenon lamps, high-pressure mercury vapor lamps and low-pressure mercury vapor lamps. The light source is preferably in the form of a broad light source emitting divergent beams in order to obtain frustum-shaped halftone dots. The light must be sufficiently intense to ensure that the exposure times are short enough for field use. The wavelength of the radiation used for the imagewise exposure should advantageously be between 300 and 700 mμ and preferably between about 300 and 400 mμ and should be chosen in accordance with the absorption of the photoinitiator used, that is to say the wavelength of the principal absorption range of the photoinitiator must be present in sufficient intensity in the emitted radiation spectrum of the light source. The laminate is then exposed through an image-bearing transparency which is brought into intimate contact with the photo-crosslinkable layer A, for example by means of a transparent plastics film which is drawn down onto it by applying a vacuum. After exposure, the unexposed areas, which are still soluble in the developer, are removed from layer A by treatment with the developer solution, such as acetone, methyl ethyl ketone, tetrahydrofuran, dimethylformamide or mixtures of these solvents. An elastic relief is left on the layer Z or — if no layer Z is used — on the base. The relief printing plate thus obtained is dried and, if necessary, after-exposed for 1 to 20 minutes. The printing plates obtained can be used immediately without any further preparation and can be fixed to the steel cylinder of a flexographic printing press by, for example, double-coated adhesive tape. The relief printing plates produced according to the invention give outstanding, sharp prints using conventional flexographic printing inks. They not only ensure very good transfer of the printing ink to paper, lacquered metal foils, cellophane or plastics films, but also display excellent abrasion resistance even in the case of long runs.

The invention is further illustrated by the following Examples in which parts are by weight. The degress of hardness mentioned were determined according to DIN 53,505 (ASTM D 676-49 T).

EXAMPLE 1 to 6

Preparation of the light-sensitive polyurethanes

Light-sensitive polyurethanes are prepared in the following manner from the components listed below. The polyester is melted in a reaction vessel provided with a stirrer and a vacuum connection and is dehydrated for 30 minutes at 120°C under a vacuum or 20 mm Hg. After adding the diisocyanate, the mixture is stirred for 2 hours at 80°C. The specified amounts of chain extender and 0.01% of dibutyl-tin-dilaurate are stirred, at 80°C, into the melt of the isocyanate prepolymer thus produced and the melt is then poured into molds and is maintained at 80°C for a further 16 hours.

EXAMPLE 1

(Polyurethane A)

387 parts (0.2 mole) of a polyester prepared from adipic acid, 1,6-hexanediol and neopentyl glycol and having an OH number of 58, 104.9 parts (0.4 mole) of bis-(4-isocyanatocyclohexyl)-methane, and 17.72 parts (0.2 mole) of but-1-ene-3,4-diol.

The Shore A hardness of the polyurethane obtained is 50.

EXAMPLE 2

(Polyurethane B)

218 parts (0.2 mole) of a polyester prepared from adipic acid, ethylene glycol and 1,4-butanediol and having an OH number of 103, 131.9 parts (0.785 mole) of hexamethylenediisocyanate, 26.42 parts (0.3 mole) of but-1-ene-3,4-diol, and 26.42 parts (0.3 mole) of but-2-ene-1,4-diol.

The Shore A hardness of the polyurethane obtained is 60.

EXAMPLE 3

(Polyurethane C)

387 parts (0.2 mole) of a polyester prepared from adipic acid, 1,6-hexanediol and neopentyl glycol and having an OH number of 58, 97.7 parts (0.582 mole) of hexamethylenediisocyanate, 17.62 parts (0.2 mole) of but-1-ene-3,4-diol, and 17.62 parts (0.2 mole) of but-2-ene-1,4-diol.

The Shore A hardness of the polyurethane obtained is 20.

EXAMPLE 4

(Polyurethane D)

218 parts (0.2 mole) of a polyester prepared from adipic acid, ethylene glycol and 1,4-butanediol and having an OH number 103, 98.8 parts (0.588 mole) of hexamethylenediisocyanate, 8.81 parts (0.1 mole) of but-1-ene-3,4-diol, and 26.42 parts (0.3 mole) of but-2-ene-1,4-diol.

The Shore A hardness of the polyurethane obtained is 70.

EXAMPLE 5

(Polyurethane E)

400 parts (0.2 mole) of a polycaprolactone having an OH number of 56, 98.8 parts (0.588 mole) of hexamethylenediisocyanate, 17.62 parts (0.2 mole) of but-1-ene-3,4-diol, and 17.62 parts (0.2 mole) of but-2-ene-1,4-diol.

The Shore A hardness of the polyurethane obtained is 89.

EXAMPLE 6

(Polyurethane F)

218 parts (0.2 mole) of the polyester mentioned in Example 2, 164.8 parts (0.98 mole) of hexamethylenediisocyanate, 35.25 parts (0.4 mole) of but-1-ene-3,4-diol, and 36.05 parts (0.4 mole) of 1,3-butanediol.

The Shore A hardness of the polyurethane obtained is 25.

EXAMPLE 7

A solution of 98.9 parts of the polyurethane A described in Example 1, 1.0 part of α-methylolbenzoin methyl ether and 0.1 part of p-methoxyphenol in 150 parts of methyl ethyl ketone is prepared by heating the components to 60°C. The viscous solution is concentrated to viscosity of 30,000 cp and is cast on a 0.1 mm thick plastics film to give a film which is 0.75 mm thick when dry. It is dried by evaporating the solvent in a stream of air. The light-sensitive film is covered with a negative and exposed for 15 minutes in a commercial flat-plate exposure unit provided with 60 watt UV fluorescent tubes. A sample exposed for the same period without a negative was found to have a Shore A hardness of 52.

The film which has been exposed imagewise is then washed out with methyl ethyl ketone in a spray washer; after 6 minutes developing time, the exposed areas have been removed completely so that a printing plate with an insoluble elastic relief is obtained. After a further 10 minutes exposure, the printing plate is dried for 20 minutes at 60°C to remove any residual solvent from the developer solution.

EXAMPLE 8

176.78 parts of polyurethane C of Example 3 are mixed with 20.0 parts of triethylene glycol diacrylate, 0.2 part of hydroquinone, 3.0 parts of α-methylolbenzoin methyl ether and 0.02 part of Zapon Fast Black (Color Index 12,195) and the mixture is dissolved in 200 parts of tetrahydrofuran at 60°C and is cast on a polyethylene terephthalate film. After drying, and evaporating the tetrahydrofuran, a 0.5 mm thick photosensitive layer is obtained, the Shore A hardness of which, after 20 minutes' exposure, is 33.

EXAMPLE 9

A further light-sensitive mixture is prepared from 178.4 parts of polyurethane B of Example 2, 20.0 parts of triethylene glycol diacrylate which is stabilized with 0.2% of hydroquinone, 1.6 parts of benzoin methyl ether and 0.02 part of New Fuchsin (Color Index 42,520) and 130 parts of tetrahyrofuran. The solution is applied with a doctor blade to an elastomeric polyurethane film of 2.1 mm in thickness and having Shore A hardness of 40, which is insoluble in methyl ethyl ketone and tetrahydrofuran, and the excess removed with it, so that after evaporation of the solvent a layer 0.6 mm thick remains on the layer Z. The bond between the two layer is excellent. The Shore A hardness of a sample of the light-sensitive layer exposed as in Example 7 and 8 is 77.

For the imagewise exposure of the upper layer applied to the intermediate layer Z of elastomeric polyurethane, the system is exposed for 15 minutes using a commercial flat-plate exposure unit (cf. Example 7). For reinforcement, the non-covered side of the layer Z is glued with an adhesive based on polychloroprene to a 0.1 mm thick polyethylene terephthalate film. After exposure, the printing plate is washed out for 8 minutes in a spray washer using methyl ethyl ketone. After a further 5 minutes ' exposure and after-drying for 1 hour at 80°C, the relief printing plate is ready for use.

EXAMPLE 10

A homogeneous mixture is prepared at room temperature from 139.5 parts of polyurethane D of Example 4, 7.5 parts of 1,1,1-trimethylolpropane triacrylate which is stabilized by 0.2% of the cerium salt of N-nitroso-cyclohexylhydroxylamine, 3.0 parts of α-methylolbenzoin methyl ether and 170 parts of methyl ethyl ketone and is cast on a 0.2 mm thick aluminum sheet. The thickness of the wet layer is so chosen that after drying a 0.85 mm thick layer is obtained on the metal base. If this layer is exposed to a 1,000 watt high-pressure mercury vapor lamp for about 2 to 3 minutes, a crosslinked elastomeric layer having Shore A hardness of 74 which is insoluble in the above-mentioned developers is obtained.

Imagewise exposure gives a letterpress printing plate which is outstandingly suitable for printing forms, Kraft papers and paper bags.

EXAMPLE 11

A solution of 187.37 parts of polyurethane E, 10.0 parts of 1,4-butanediol diacrylate, 0.2 parts of phenothiazine, 2.4 parts of benzoin methyl ether and 0.03 part of Zapon Fast Black (Color Index 12,195) in 300 parts of acetone is prepared at room temperature and concentrated in vacuo to give an approx. 50% strength solution which is cast on a polyethylene terphthalate film and dried. The non-covered side of the light-sensitive layer is wetted with tetrahydrofuran and laminated onto an elastomeric polyurethane film Z having a Shore A hardness of 50. This laminate is then exposed for 10 minutes through a negative in an exposure apparatus with 60 watt UV fluorescent tubes. After washing out with methyl ethyl ketone, an elastomeric relief image which corresponds to the transparent portions of the negative and exhibits excellent adherence to the sheet Z is left on the polyurethane sheet Z. A specimen of the light-sensitive layer has a Shore A hardness of 77 after complete exposure.

EXAMPLE 12

A 0.6 mm thick layer based on polyurethane F contains 147.3 parts of polyurethane F, 50.0 parts of triethylene glycol diacrylate, 0.3 part of hydroquinone and 2.4 parts of α-methylolbenzoin methyl ether which are dissolved in 200 parts of tetrahydrofuran, cast on polyethylene terephthalate film and dried in a stream of air. A 2 mm thick sheet of natural rubber is coated with a chloroprene adhesive and the above polyurethane layer is adhered to this rubber sheet. The Shore A hardness of the exposed upper layer is 52 and the Shore A hardness of the vulcanized natural rubber sheet is 30. The ready-to-use printing plate is produced by exposure, washing out and drying in the manner described in the preceding Examples.

EXAMPLE 13

A photo-sensitive printing plate layer is obtained from 100 parts of a commercial phenoxy resin, 319 parts of polyurethane A and 75 parts of 1,4-butanediol diacrylate, 5 parts of α-methylolbenzoin methyl ether and 1 part of phenothiazine by dissolving in 600 parts of tetrahydrofuran at 60°C, applying the resulting solution to an elastomeric polyurethane sheet having a Shore A hardness of 45 and evaporating the added solvent. Exposure of a sample of the upper layer gives a Shore A hardness of 67.

EXAMPLE 14

10,000 parts of a dry and bubble-free aliphatic polyester glycol having a hydroxyl number of approx. 60, an acid number of less than 1.5 and a molecular weight of about 2,000 ($^{(R)}$Desmophen 2,200 manufactured by Farbenfabriken Bayer AG, Leverkusen, Germany, are mised with 5.0 parts of lead octoate as the catalyst and 900 parts of 2,4-toluylenediisocyanate and the mixture is poured into a centrifugal casting mold having an area of 5 m². The mixture is cured for 15 minutes at 130°C whilst being centrifuged. The resulting bubble-free 2 mm thick polyurethane elastomer layer Z with a Shore A hardness of 40 exhibits very good elastic properties, with resilience values above 50% (DIN 53,512) and is substantially solvent-resistant. The elastomer layer Z is glued with a commercial polyurethane adhesive to a dimensionally stable polyethylene terephthalate film acting as base. A layer of the light-sensitive mixture indicated in Example 9 is applied to the intermediate layer Z bonded to the base, and the resulting laminate is exposed imagewise as in Example 9 and developed to give a relief printing plate which gives excellent printing copies.

EXAMPLE 15

1,000 parts of a hydroxyl-containing polyether based on a reaction product of 1,1,1-trimethylolpropane with excess 1,2-propylene oxide, and having a hydroxyl number 41 ($^{(R)}$Pluracol-4040 manufactured by BASF Wyandotte Corporation, Wyandotte, Michigan, U.S.A.) are mixed with 120 parts of 2,4 toluylene diisocyanate and 0.1 part of N,N'-endoethylene-piperazine as the activator and the mixture is heated at 80°C for 1 hour. 52 parts of a 1,2-propylene oxide polymer with two hydroxyl groups per molecule and a molecular weight of about 1,000 ($^{(R)}$Pluracol P 1010 manufactured by by BASF Wyandotte Corporation) are mixed into the reaction product after it has cooled, and the mixture is poured into a 3 mm high mold resting on a base of 125µ polyethylene terephthalate film and is cured for 30 minutes at 130°C. The cured insoluble elastomeric intermediate layer Z having a Shore A hardness of 20 adheres sufficiently well to the polyethylene terephthalate base and is bonded to the light-sensitive layer A indicated in Example 7, to give an elastic laminate. It is exposed imagewise as indicated in Example 7 and developed to form a relief plate for flexographic printing which gives excellent, sharp prints on lacquered metal foils.

EXAMPLE 16

970 parts of a hydroxyl-containing liquid polyether having a hydroxyl number of 58 and based on a reaction product of polyoxypropylene with glycerol ($^{(R)}$Pluracol GP 3030 manufactured BASF Wyandotte Corporation) are mixed with 114 parts of a reaction product of polyoxypropylene with sucrose having ahydroxyl number of 525 ($^{(R)}$Pluracol SP 760 manufactured by BASF Wyandotte Corporation). 171 parts of toluylenediisocyanate and 5 parts of dibutyl-tin dilaurate and the mixture is poured into a 2 mm high mold resting on a 1 mm thick commercial polyurethane base. After curing for 30 minutes at 130°C, an elastic insoluble layer Z having a Shore A hardness of 53, which adheres firmly to the base, is obtained.

The light-sensitive layer A described in Example 11 is laminated with its non-covered side to the layer Z. After imagewise exposure and washing out as described in Example 11, a relief printing plate which gives very good sharp prints on Kraft papers is obtained.

We claim:

1. An element for the production of a flexographic printing plate, comprising dimensionally stable base and a photo-crosslinkable layer of a photo-crosslinkable material containing 0.01 to 10 percent by weight of photoinitiator and, if desired, further conventional additives, wherein the photo-crosslinkable material of the layer consists essentially of (a) 70 to 100 percent by weight of a non-crystallizing polyurethane elastomer which is soluble in developer and has been produced by reaction of an aliphatic saturated polyester glycol having a molecular weight of about 400 to 4,000 with an aliphatic diisocyanate and at least one low molecular weight aliphatic diol of which 25 to 100 mole percent is but-1-ene-3,4-diol, as chain extender, wherein the molar ratio is about 3 to 6 parts of diisocyanate and 2 to 5 parts of low molecular weight diol per part of polyester glycol and the NCO/OH molar ratio always being about 0.9 to 1.0 and (b) 0 to 30 percent by weight of an acrylic or allylmonomer which is substantially compatible with the polyurethane elastomer, and the layer A has a Shore A hardness of 30° to 90° in the photo-crosslinked state.

2. An element as claimed in claim 1, wherein the photo-crosslinkable is firmly bonded to a non-photo-crosslinkage layer comprising a polyurethane elastomer which is insoluble in the developer and which has a Shore A hardness of from 15° to 70° which is at least 20° Shore A less than the hardness of the photo-crosslinkable layer in the photo-crosslinked state.

* * * * *

UNITED STATES PATENT AND TRADEMARK OFFICE
CERTIFICATE OF CORRECTION

PATENT NO. : 3,948,665
DATED : April 6, 1976
INVENTOR(S) : RICHTER et al

It is certified that error appears in the above–identified patent and that said Letters Patent are hereby corrected as shown below:

In Column 12, Line 2 of Claim 2, delete " photo-crosslinkable is ... " and substitute -- photo-crosslinkable layer is ... --

Signed and Sealed this

Twenty-second Day of March 1977

[SEAL]

Attest:

RUTH C. MASON
*Attesting Officer*

C. MARSHALL DANN
*Commissioner of Patents and Trademarks*